(12) United States Patent
Sobelman

(10) Patent No.: US 7,461,192 B2
(45) Date of Patent: Dec. 2, 2008

(54) INTERFACE FOR BRIDGING OUT-OF-BAND INFORMATION AND PREVENTING FALSE PRESENCE DETECTION OF TERMINATING DEVICES

(75) Inventor: Michael J. Sobelman, Campbell, CA (US)

(73) Assignee: Rambus Inc., Los Altos, CA (US)

( * ) Notice: Subject to any disclaimer, the term of this patent is extended or adjusted under 35 U.S.C. 154(b) by 182 days.

(21) Appl. No.: 11/014,260

(22) Filed: Dec. 15, 2004

(65) Prior Publication Data
US 2006/0129733 A1    Jun. 15, 2006

(51) Int. Cl.
G06F 13/14   (2006.01)
G06F 13/42   (2006.01)
G06F 11/00   (2006.01)

(52) U.S. Cl. .................. 710/305; 710/105; 714/48

(58) Field of Classification Search .......... 710/105, 710/260, 305, 316, 315, 100, 313; 370/402, 370/467, 389, 459, 219, 503; 714/799, 48; 341/59, 102, 58; 398/183; 439/378; 375/220, 375/242; 713/1, 324

See application file for complete search history.

(56) References Cited

U.S. PATENT DOCUMENTS

| | | | |
|---|---|---|---|
| 4,486,739 A * | 12/1984 | Franaszek et al. | 341/59 |
| 5,283,905 A | 2/1994 | Saadeh et al. | 395/750 |
| 5,577,069 A | 11/1996 | Lau et al. | 375/242 |
| 5,684,479 A * | 11/1997 | Hayashi | 341/102 |
| 5,771,387 A | 6/1998 | Young et al. | 710/260 |
| 6,070,214 A * | 5/2000 | Ahern | 710/315 |
| 6,295,010 B1 * | 9/2001 | Thiesfeld | 341/58 |
| 6,418,494 B1 * | 7/2002 | Shatas et al. | 710/305 |
| 6,704,816 B1 * | 3/2004 | Burke | 710/100 |
| 6,897,793 B1 * | 5/2005 | Kim et al. | 341/59 |
| 7,020,834 B2 * | 3/2006 | Chiang et al. | 714/799 |
| 7,039,064 B1 * | 5/2006 | Paulson et al. | 370/459 |
| 7,065,101 B2 * | 6/2006 | Ziegler et al. | 370/467 |
| 7,111,158 B1 * | 9/2006 | Burroughs et al. | 713/1 |
| 7,113,507 B2 * | 9/2006 | Shin et al. | 370/389 |
| 7,124,234 B2 * | 10/2006 | Marushak et al. | 710/316 |
| 7,162,565 B1 * | 1/2007 | Kolokowsky et al. | 710/313 |
| 7,251,280 B2 * | 7/2007 | Chiang | 375/242 |
| 7,254,732 B2 * | 8/2007 | Bashford et al. | 713/324 |

(Continued)

OTHER PUBLICATIONS

Serial ATA Workgroup, "Serial ATA: High Speed Serialzed AT Attachment," Aug. 29, 2001, Serial ATA Workgroup, Revision 1.0, pp. 37 and pp. 87-96.*

(Continued)

Primary Examiner—Glenn A. Auve
Assistant Examiner—Trisha Vu
(74) Attorney, Agent, or Firm—Morgan, Lewis & Bockius LLP

(57) ABSTRACT

A device includes a first interface to receive a signal from a first communication link, wherein the receive signal includes out-of-band (OOB) information. A detector coupled to the first interface detects the OOB information. An encoder coupled to the detector encodes the OOB information into one or more symbols (e.g., control characters). A second interface is coupled to the encoder and a second communication link (e.g., a serial transport path). The second interface transmits the symbols on the second communication link. The device also includes mechanisms for preventing false presence detection of terminating devices.

30 Claims, 10 Drawing Sheets

U.S. PATENT DOCUMENTS

2003/0158991 A1* 8/2003 Deyring et al. ............... 710/305
2004/0081179 A1* 4/2004 Gregorcyk, Jr. ............. 370/402
2004/0120353 A1* 6/2004 Kim et al. .................... 370/503
2004/0219955 A1 11/2004 daCosta ....................... 455/574
2005/0149656 A1* 7/2005 Seto ............................ 710/105
2005/0169356 A1* 8/2005 Matsumoto et al. ......... 375/220
2005/0186832 A1* 8/2005 Nemazie ..................... 439/378
2005/0220008 A1* 10/2005 Grimsrud et al. ............ 370/219
2005/0232643 A1* 10/2005 Aronson et al. ............. 398/183

OTHER PUBLICATIONS

International Search Report for International Application No. PCT/US2005/038708, mailed Jul. 5, 2006.

Serial ATA Workgroup, "Serial ATA: High Speed Serialized AT Attachment," Aug. 29, 2001, Revision 1.0, pp. 37, 87-96.

* cited by examiner

INTERFACE FOR BRIDGING OUT-OF-BAND INFORMATION AND PREVENTING FALSE PRESENCE DETECTION OF TERMINATING DEVICES

TECHNICAL FIELD

The disclosed embodiments relate generally to data communication systems, and in particular to embodiments for bridging out-of-band (OOB) information across one or more intermediate devices, located between a first device and another device, and for preventing false presence detection of terminating devices.

BACKGROUND

Since the advent of the first microprocessor, the exponential growth in computing power has driven a similar need for increased data communication transfer rates. For internal data communications between a computer and its memory or internal peripherals, a shared bus has been the conventional interface structure. An example of a conventional internal data bus structure is the PCI interface. The PCI bus is a high-performance successor to the original IBM PC internal peripheral bus, the ISA bus. Even with a 133 MB/s data rate, the PCI bus has been extended to keep up with the data transfer needs of more powerful processors by doubling the clock rate from 33 MHz to 66 MHz, doubling the data path width from 32 bits to 64 bits, and including multi-rate clocking and a more efficient data transfer protocol.

Despite these extensions, the parallel PCI bus may eventually be replaced by a high-speed serial link architecture called PCI EXPRESS. The PCI EXPRESS architecture uses low-voltage differential signaling, a packet-based data transmission protocol and an extendable high-speed data rate beginning at 2.5 Gb/s. A typical PCI EXPRESS implementation may use a four-wire interface to provide a bi-directional transmit signal path and receive signal path. Such an implementation would use a first pair of wires to transmit a differential signal along a unidirectional signal path for transmitting data from a transmitter on a first device to a receiver on a second device, and a second pair of wires would be used to transmit another differential signal along another unidirectional signal path for transmitting data from a transmitter on the second device to a receiver on the first device. Although more wires are required per data bit than with some conventional data buses, the PCI EXPRESS message-based protocol and embedded clocking eliminates the need for many of the data control signals required by systems that utilize such conventional data buses.

Despite the advantages of the PCI EXPRESS architecture, implementing the PCI EXPRESS protocol in a data communication system can be difficult and expensive. For example, the PCI EXPRESS protocol includes physical signaling to indicate OOB state information (e.g., Electrical Idle, Receive Detect, Beacon Signal, etc.). If the two end devices of a serial, high-speed communication link support physical OOB signaling, then one or more intermediate devices in the link (e.g., a repeater, multiplexer/demultiplexer, a router, bridge, hub or the like) may also need to support physical OOB signaling.

Additionally, the PCI EXPRESS protocol includes presence detection and loss of signal (LOS) mechanisms for detecting missing or failed terminating devices (e.g., a "missing" graphics card that has been removed from a socket at one end of the PCI EXPRESS bus). If there are one or more intermediate devices in the link between an originating device (e.g., a microprocessor or computer chipset) and a terminating device (e.g., a graphics processor, graphics card, sound card, host bus adaptor, network interface card, secondary processor or microcontroller, or other peripheral or supplemental device), then there is a possibility of false presence detection of the terminating device. In this case, the intermediate device may mask from the originating device the true connection status of the terminating device. While the originating device may be able to detect a missing or failed terminating device at a higher layer in the protocol stack (e.g., a logical layer above the physical layer), such detection may result in a loss of cycle time and power, which may be unacceptable for some applications.

Accordingly, mechanisms for bridging OOB information across a sequence of interfaces and/or for preventing false presence detection of terminating devices are desired.

BRIEF DESCRIPTION OF THE DRAWINGS

For a better understanding of the embodiments, reference should be made to the following detailed description taken in conjunction with the accompanying drawings, in which.

Like reference numerals refer to corresponding parts throughout the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the embodiments. However, it will be apparent to one of ordinary skill in the art that these and other embodiments may be practiced without these specific details. In other instances, well-known methods, procedures, components, and circuits have not been described in detail so as not to unnecessarily obscure aspects of these and other embodiments.

In some embodiments, the disclosed technology comprises a first device that includes a first interface having an input for coupling the first device to a first communication link. The first interface can receive a signal via the first communication link. The signal may include out-of-band (OOB) information. The OOB information, or a subset of the OOB information, may represent physical layer signals (e.g., electrical or optical signal states). The first device also includes a detector, coupled to the first interface, for detecting the OOB information. An encoder coupled to the detector and the first interface encodes the OOB information into one or more symbols (e.g., control characters). The first device also includes a second interface that is coupled to the encoder. The second interface has an output for coupling the second interface to a second communication link (e.g., a serial transport path). The second interface transmits the symbols on the second communication link.

In some embodiments, an intermediate device that is coupled to first and second communication links has the ability to prevent a first device coupled to first communication link from falsely detecting a second device coupled to a second communication link. In some embodiments, the intermediate device includes a receiver, which is coupled to the first communication link, to receive data from the first device. The intermediate device may include one or more switches for switchably coupling a termination network (e.g., a resistive network) to inputs of the receiver. An actuator, coupled to the switches, may control the state of the switches in response to a connection status signal indicating whether a second device is coupled to the second communication link.

Figure 1:
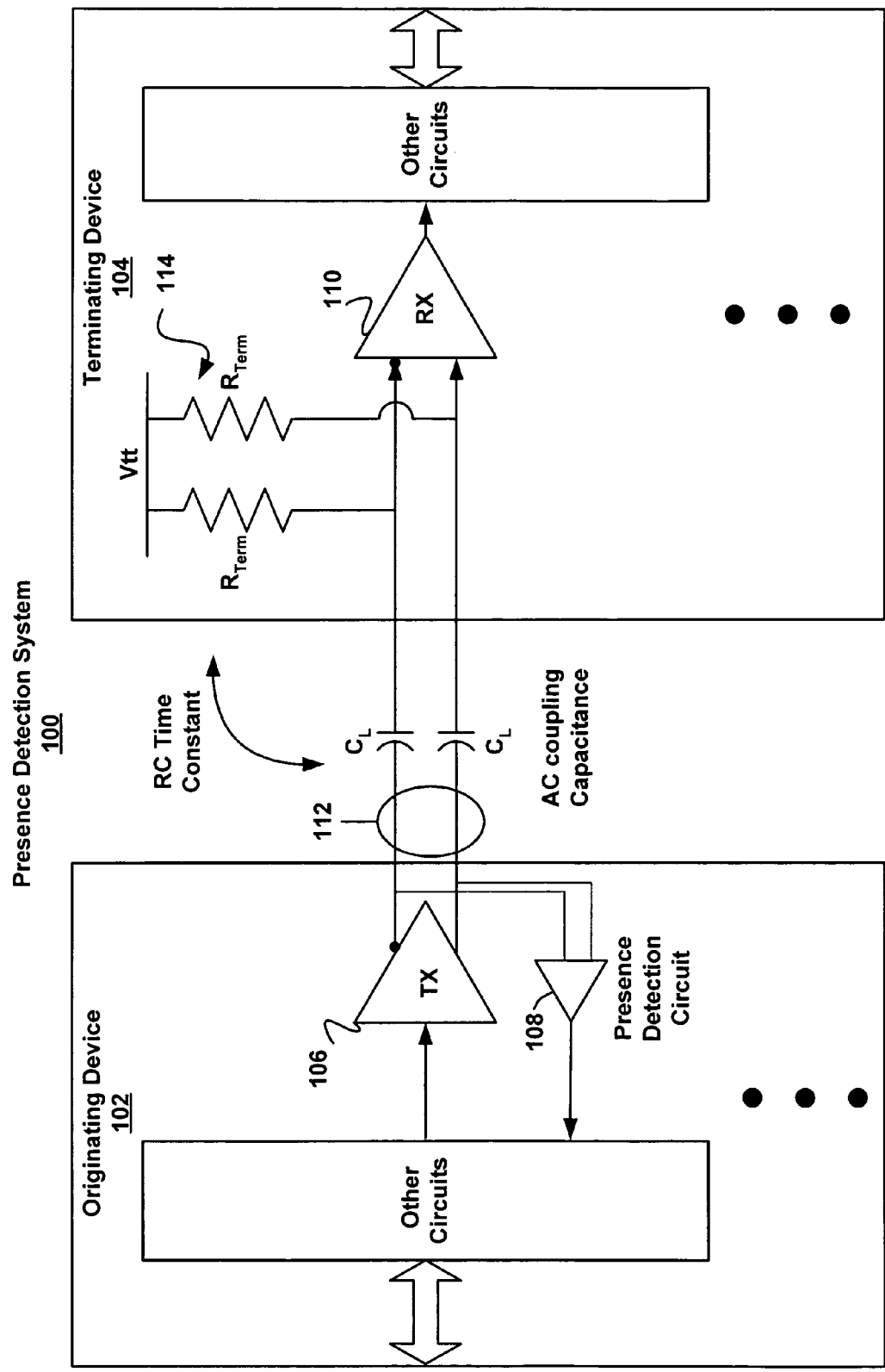
FIG. 1 is a block diagram of a presence detection system.

FIG. 1 is a block diagram of a conventional presence detection system 100. The system 100 includes an originating device 102 capacitively coupled to a terminating device 104 via a serial link 112 (e.g., PCI EXPRESS transport path). The system 100 can be any data communication system that includes presence detection capability, such as a personal computer (PC) with a PCI EXPRESS architecture. In a PC employing PCI EXPRESS architecture, the originating device 102 may be, for example, a microprocessor or computer chipset and the terminating device 104 may be, for example, a peripheral device, such as a graphics processor, graphics card, sound card, host bus adaptor, network interface card, secondary processor or microcontroller, other peripheral or supplemental device or the like.

The originating device 102 generally includes a transmitter 106 and a presence detection circuit 108. The terminating device 104 generally includes a termination network 114 and a receiver 110. Although device 102 is described as an "originating" device and device 104 is described as a "terminating device", it should be understood that device 102 would typically include additional circuitry for receiving signals and device 104 would typically include additional circuitry for transmitting signals. Devices 102 and 104 would, furthermore typically include additional circuitry to perform other functions. To facilitate a simplified conceptual description of the system 100, such additional circuitry is represented as "Other Circuits" in FIG. 1.

During operation of the originating device 102 (e.g., during system initialization), a differential signal is transmitted on the serial link 112. In some devices, the presence detection circuit 108 detects the fact that the termination device 104 is coupled to serial link 112 using known techniques to measure the rate of change of the differential voltage signal on the serial link 112. The rate of change of the differential voltage signal is influenced at least in part by the resistive-capacitive (RC) time constant associated with the RC circuit formed by the termination network 114 and the AC coupling capacitance CL of the serial link 112.

Figure 2A:
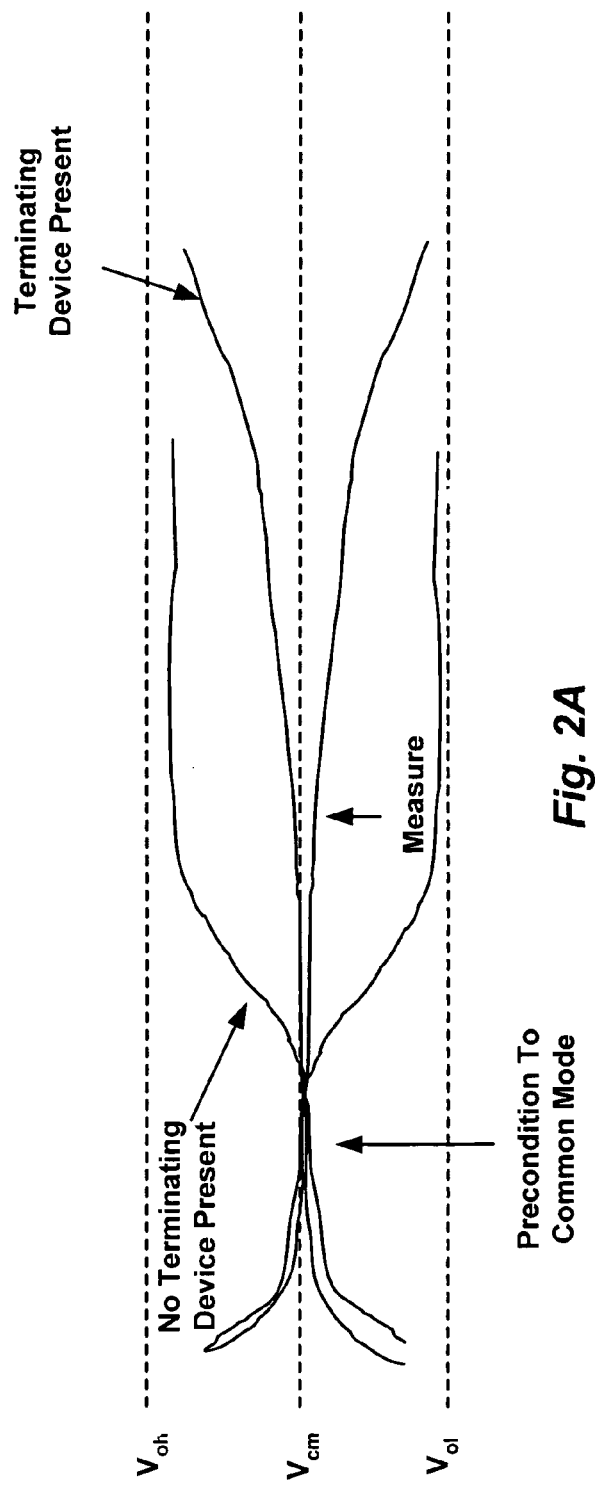
FIG. 2A is a graph of a differential voltage signal illustrating presence detection.

FIG. 2A is a graph of a differential voltage signal illustrating the difference in the rate of change of a differential voltage signal for cases where a terminating device 104 is connected to and disconnected from an originating device 102. It can be observed from FIG. 2A, that when the terminating device 104 is connected to the originating device 102 the voltage will pull-up or pull-down more slowly. When the terminating device 104 is not connected to the originating device 102, the voltage will pull-up or pull-down more quickly. The presence detection circuit 108 uses known techniques to detect this rate of change and to alert the originating device 102 in the event that the terminating device 104 is disconnected, so that an appropriate action can be taken by the system 100.

Figure 2B:
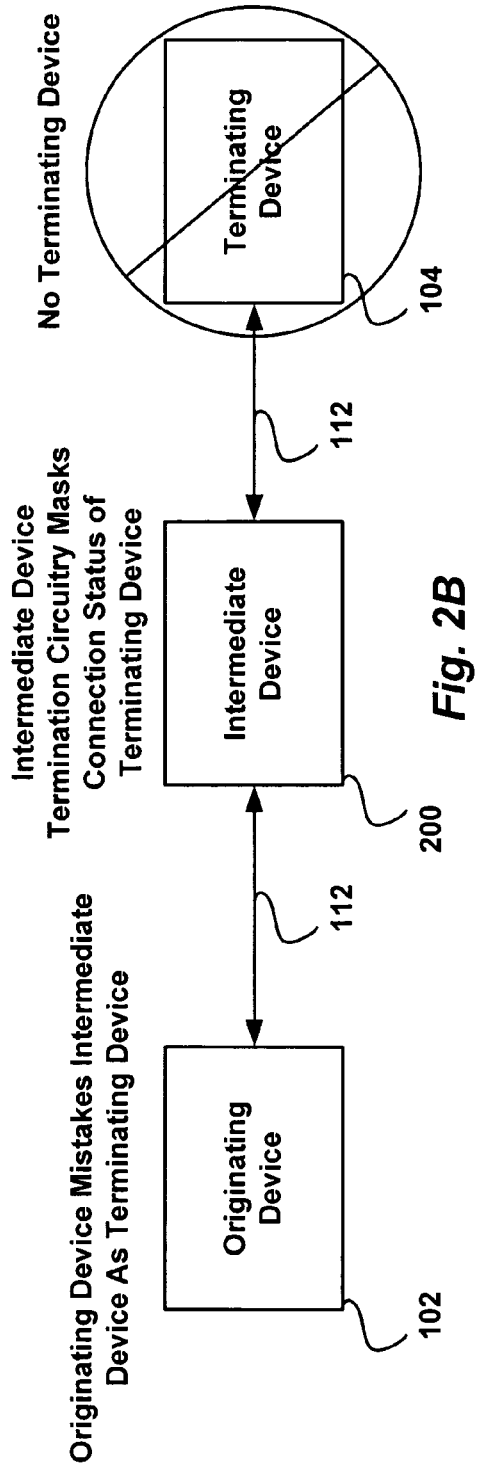
FIG. 2B is a block diagram of a communication link with an intermediate device illustrating false presence detection.

FIG. 2B is a block diagram illustrating the problem of false presence detection that can occur when an intermediate device 200 is connected between an originating device 102 and the terminating device 104. It should be apparent that the terms "originating device" and "terminating device" are used solely to facilitate the description of the disclosed embodiments and should not be construed to imply the ability or inability of a particular embodiment to source and/or terminate signals. The intermediate device 200 can be any device located between the originating device 102 and the terminating device 104, including, for example, a multiplexer/demultiplexer, a router, bridge, hub or the like. A false presence detection occurs when the presence of the intermediate device 200 on the link 112 is mistakenly interpreted by a presence detection circuit or logic, such as the presence detection circuit 108, in the originating device 102 as indicating a positive connection status of the terminating device 104. Thus, the intermediate device 200 effectively masks from the originating device 102 the true connection status of the terminating device 104. While the originating device 102 may be able to detect a missing or failed terminating device 104 at a higher layer in the protocol stack (e.g., at a logical layer), such detection may result in a loss of cycle time and power, which may be unacceptable for some applications. In particular, when an intermediate device 200 is included in the link 112, and the link 112 is a PCI EXPRESS transport path, it would be highly desirable for the intermediate device to be capable of sensing the presence or absence of the terminating device 104 using physical layer signal processing methods, and to make itself transparent (i.e., "invisible" to the originating device 102) if the terminating device 104 is not present. Otherwise, the originating device 102 will detect the presence of the intermediate device 200 and may enter a compliance state (after logic timeout). In PCI EXPRESS systems, exiting a compliance state after a false detection of a terminating device may require a hard reset (sometimes called a "fundamental reset") of the system, which may be unacceptable for some applications.

Figure 3:
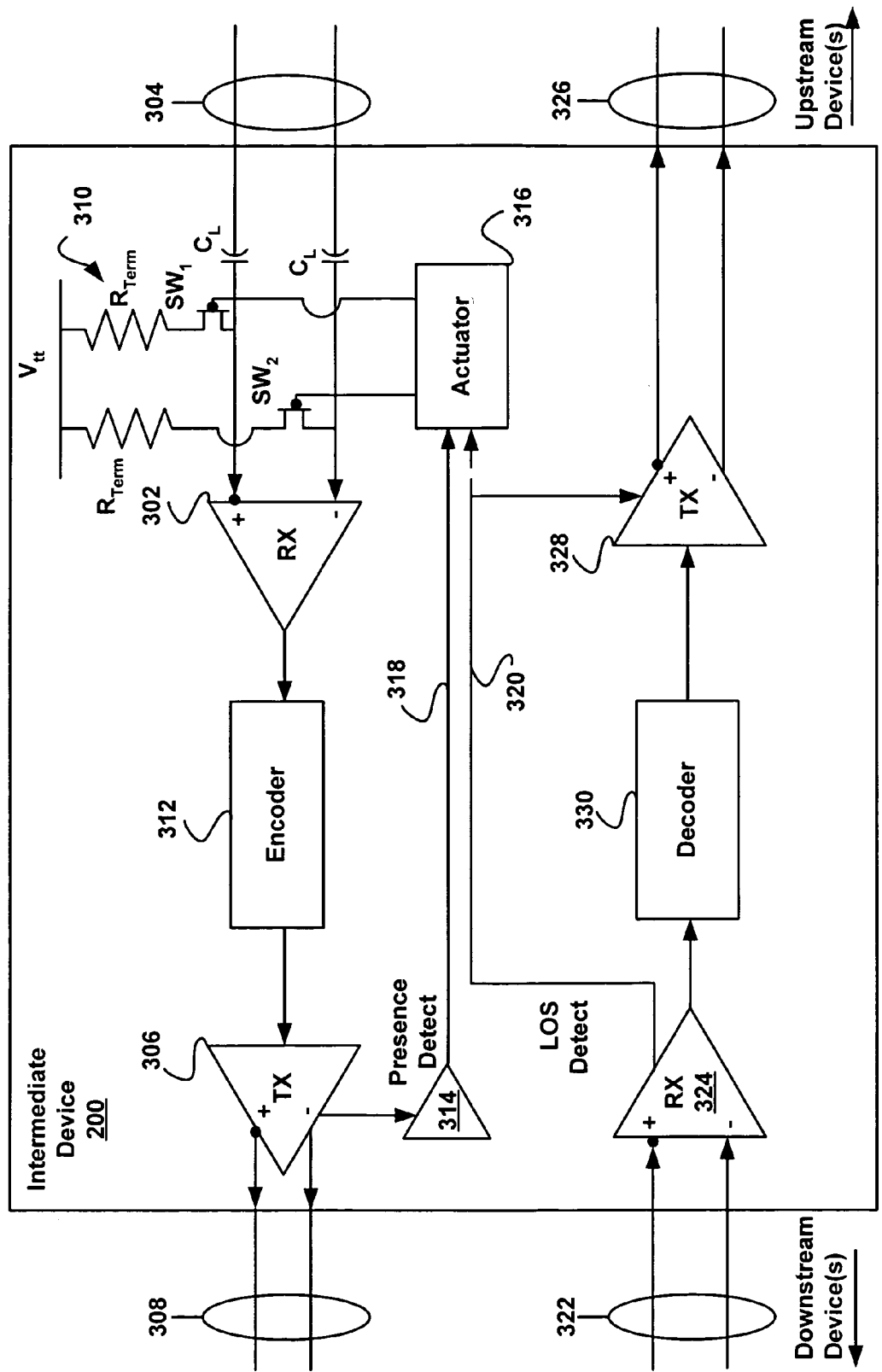
FIG. 3 is a block diagram of an embodiment of the intermediate device shown in FIG. 2B, including circuitry for preventing false presence detection of terminating devices.

FIG. 3 is a block diagram of an embodiment of the intermediate device 200 shown in FIG. 2B, including circuitry for preventing false presence detection of terminating devices. In some embodiments, the intermediate device 200 may receive differential signals from an originating device (not shown), such as the originating device 102, via a receiver 302 and an upstream receive link 304, to encode the received signal into symbols using an encoder 312, and to transmit differential signals corresponding to symbols to a terminating device (not shown), such as terminating device 104, via a transmitter 306 and a downstream transmit link 308. Similarly, the intermediate device 200 may receive differential signals corresponding to symbols from a terminating device via a receiver 324 and a downstream receive link 322, to decode the symbols using a decoder 330, and to transmit differential signals to an originating device via a transmitter 328 and an upstream transmit link 326.

Note that the terms "upstream" and "downstream" are used solely to facilitate the description of the embodiments and should not be construed to imply the ability or inability of an embodiment to source and/or terminate signals. While the intermediate device 200 is configured for use with a differential signaling system, it should be apparent that the intermediate device 200 can be modified for use with a single-ended signaling system. Therefore, in some embodiments one or more of the links, such as upstream receive link 304, downstream transmit link 308, downstream receive link 322 and upstream transmit link 326, may be single-ended. In addition, one or more links to the originating device and/or the terminating device may be bi-directional. The intermediate device 200 is suitable for use with a PCI EXPRESS architecture, but can be modified to work other protocols that include presence detection capability.

During operation (e.g., system initialization), the intermediate device 200 receives differential signals from the upstream originating device via the upstream receive link 304. The upstream receive link 304 is coupled to the receiver 302 via a termination network 310 for terminating the upstream receive link 304. In some embodiments, the termination network 310 is coupled to the upstream receive link 304 via switches $SW_1$ and $SW_2$. The switches $SW_1$ and $SW_2$ are controlled by an actuator 316 coupled to signal lines 318 and 320. In some embodiments, the actuator 316 can be implemented with one or more logic devices, such as an OR gate or a NOR gate. The signal line 318 is coupled to a presence detection circuit 314, which, in turn, is coupled to the transmitter 306 for transmitting differential signals corresponding to the symbols via the downstream transmit link 308. The signal line 320 is coupled to the receiver 324. Receiver 324 receives differential signals corresponding to symbols from the terminating device (not shown) via the downstream receive link 322. If the terminating device is disconnected from the downstream transmit link 308, then the presence detection circuit 314 will sense the disconnection and send a connection status signal to the actuator 316 via the signal line 318 indicating the disconnected status. The presence detection circuit 314 may detect the disconnection in the same manner as described above with reference to FIG. 2A. Alternately, the presence detection circuit 314 may detect the disconnection using any other technique suitable for detecting the presence, or lack of presence, of a device on link 308. In yet other embodiments, a "loss of signal" condition on a return link 322 may be indicative of the lack of a terminating downstream device. In such embodiments, presence detection circuit 314 may be eliminated in favor of a "loss of signal" detector (shown in FIGS. 3 and 7 as being included in receivers 324 and 704, respectively).

It may be noted that a presence detection signal and a "loss of signal" condition are both examples of physical layer signals that may be detected and handled by physical layer circuitry and protocols. Physical layer signals represent signal or connection states, and many signal or bus protocols include protocols for handling one or more physical layer signals at the physical layer of a protocol stack. Since physical layer signals represent signal and connection states, it is important to quickly detect and react to the condition or conditions represented by these physical layer signals. Failure to do so will typically result in a significant delay in detecting the condition or conditions, typically by software at a higher protocol layer than the physical layer.

In some embodiments, if the terminating device is connected to the downstream receive link 322 but has otherwise failed (e.g., a loss of signal persists for at least a predefined, threshold period of time), then the receiver 324 will send a connection status signal to the actuator 316 via the signal line 320 indicating the loss of signal status. In addition, when a loss of signal (LOS) is detected by receiver 324, the transmitter 328 is disabled, for example by tri-stating it's output. However, in some embodiments, the terminating device coupled to the other end of the downstream transmit link 308 may go into an "Electrical Idle" mode, where both the + and − outputs of the transceiver 328 are set to the same voltage, e.g. a common mode voltage. In these embodiments, the "loss of signal" is indicative of an "idle" device but not necessarily a disconnected device. Therefore, in these embodiments, the LOS signal on signal line 320 is not coupled to the actuator 316, because the LOS state (by itself) does not mean that the downstream device is not present.

In response to the signals on signal lines 318 and 320, the switches $SW_1$ and $SW_2$ can be commanded by the actuator 316 to either an opened state or closed state resulting in either disconnection, when the switches are in the open state, or connection, when the switches are in the closed state, of the termination network 310 from the upstream receive link 304. When the termination network 310 is disconnected from the upstream receive link 304, the line characteristics of the upstream receive link 304 are similar to the line characteristics of the link 304 when there is no terminating device connected to the link 304. These line characteristics may be observed by the originating device, essentially making the intermediate device 200 transparent or "invisible" to a presence detect circuit, such as the presence detection circuit 108, in the originating device. In another embodiment, switches are used to replace the low impedance resistors of the termination network 310 with high impedance resistors when the circuitry of the intermediate device 200 determines that a terminating device (i.e., on link 308 and/or link 322) is not present.

The false presence detection avoidance technique described above for a single intermediate device 200 can be extended to multiple intermediate devices connected in series. If a terminating device is disconnected, or otherwise fails, the intermediate device 200 directly connected to the failed terminating device can react to the change in line characteristics of its downstream transmit and/or receive links 308, 322, as previously described. In response to a change in line characteristics, the intermediate device 200 can reconfigure its upstream termination network 310 to change the line characteristics of its upstream receive link 304, which, for this example, is assumed to be connected to another upstream intermediate device 200. In some embodiments, multiple terminating devices may share the same serial transport path with the downstream intermediate device (e.g., bridge, hub, router, etc.). In these embodiments, OOB information containing presence detection information for each terminating device can be sent to the upstream intermediate device in a multiplexed signal via a serial transport path. For instance, the multiplexed signal may be time division multiplexed, with data signals and OOB information corresponding to each terminating device occupying a predefined time slice of the multiplexed signal. Such systems are described more fully below with respect to FIGS. 4-8.

Figure 4:
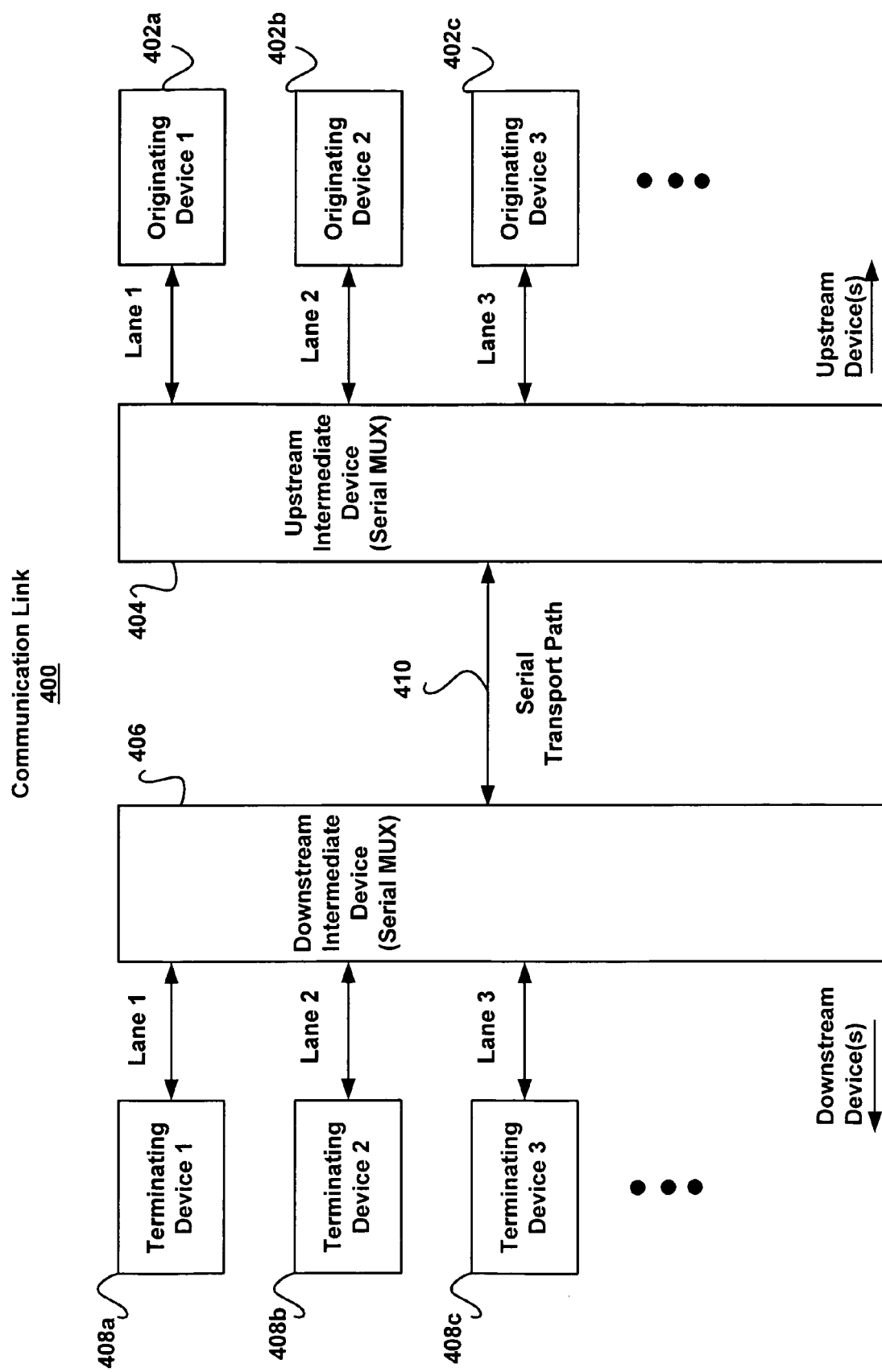
FIG. 4 is a block diagram of a multiplexed communication link with multiple originating devices and terminating devices illustrating signaling of OOB information.

FIG. 4 is a block diagram of an embodiment of a communication link 400, including an upstream intermediate device 404 and a downstream intermediate device 406. The upstream intermediate device 404 is coupled to one or more originating devices 402. The downstream intermediate device 406 is coupled to one or more terminating devices 408. The upstream intermediate device 404 is coupled to the downstream intermediate device 406 via a serial transport path 410. The serial transport path may include one or more signal lines. The one or more signal lines may comprise a bus. Each of the originating and terminating devices 402, 408, are coupled to the intermediate devices 404, 406 via a "Lane." While FIG. 4 represents each of the "Lanes" as being bidirectional, in some embodiments a "Lane" may be unidirectional. Thus, each "Lane" includes at least a transmit signal path. For a differential signaling system, a "Lane" includes at least a transmit signal path. When a Lane is bidirectional, the Lane includes both a transmit signal path and a receive signal path. For a differential signaling system, a bidirectional Lane includes a transmit signal pair and a receive signal pair. As a result, when the system shown in FIG. 4 includes bidirectional Lanes using differential signaling, the intermediate devices 404 and 406 include at least a four-wire interface for each Lane. The originating 402, terminating 408 and intermediate devices (404, 406) can communicate with each other via the serial transport path 410 using communication protocols and PHY layer standards, including but not limited to PCI EXPRESS and protocols such as the SATA protocol.

Figure 5:
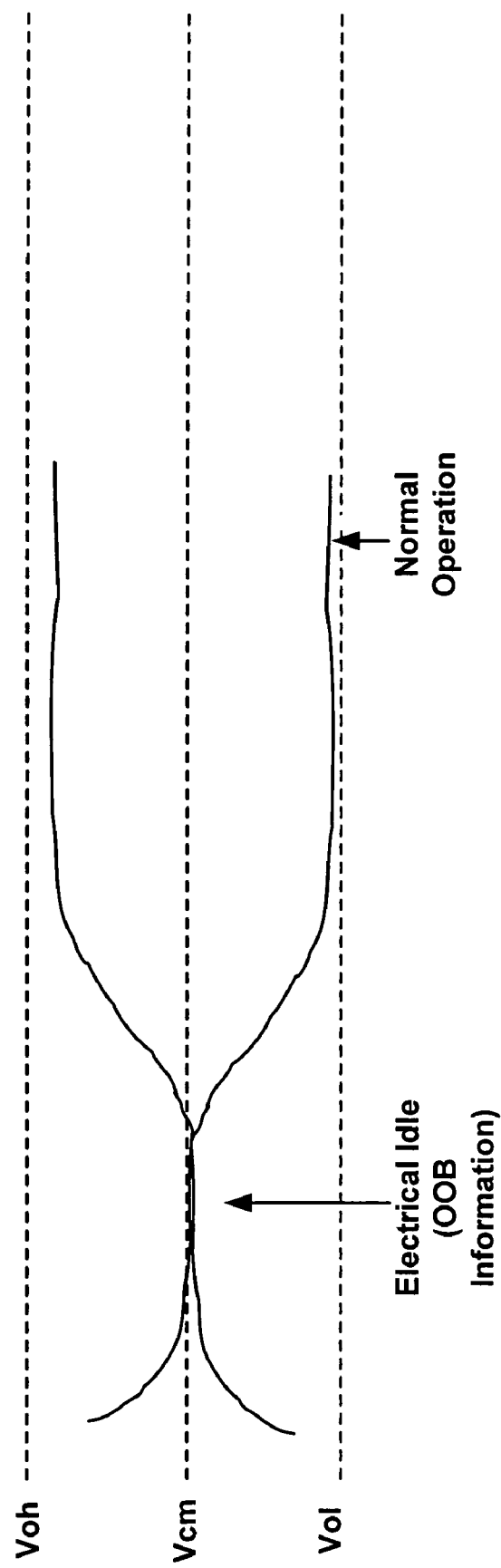
FIG. 5 is a graph of a differential voltage signal illustrating OOB information.

In some embodiments, the intermediate devices 404 and 406 may include serial multiplexers/demultiplexers. In such embodiments, and during operation, data packets originating from the originating devices 402 are multiplexed into one or more serial bit streams by the upstream intermediate device 404 and transmitted onto one or more serial transport paths 410. For ease of explanation, a system using one serial bit stream and one serial transport path 410 will be discussed, but the following explanation is equally applicable to embodiments using two or more parallel bit streams and serial transport paths 410. Furthermore, data packets may be sent from the terminating devices 408 to the originating devices 402, for example using a parallel set of signal paths, and the following explanation is also applicable to that data stream (except that the roles of the various devices are reversed). Returning to the discussion of the data packets being transmitted from an originating device 402 to a terminating device 408, the serial bit stream is received and demultiplexed by the downstream intermediate device 406 into individual packets which are routed to the appropriate terminating device 408. In some PHY layer standards, OOB state information is transmitted using PHY layer signaling (e.g., electrical, optical). For example, in the PCI EXPRESS protocol, an "Electrical Idle" signal can be represented by a common mode differential voltage level ($V_{cm}$), as shown in FIG. 5. Other PCI EXPRESS OOB information includes Beacon signals. The SATA protocol also includes OOB signaling (e.g., SATA COMReset/COMInit, COMwake).

To transmit physical layer OOB information from an originating device, such as originating device 402a, to a terminating device, such as terminating device 408a, would typically require the intermediate devices 404 and 406 to include circuitry that can detect and identify OOB information. Such a capability would typically require modification of the intermediate devices 404 and 406, which may be too costly for some applications. To avoid such modification, an encoding scheme can be employed, as discussed next with respect to FIGS. 6-8.

Figure 6:
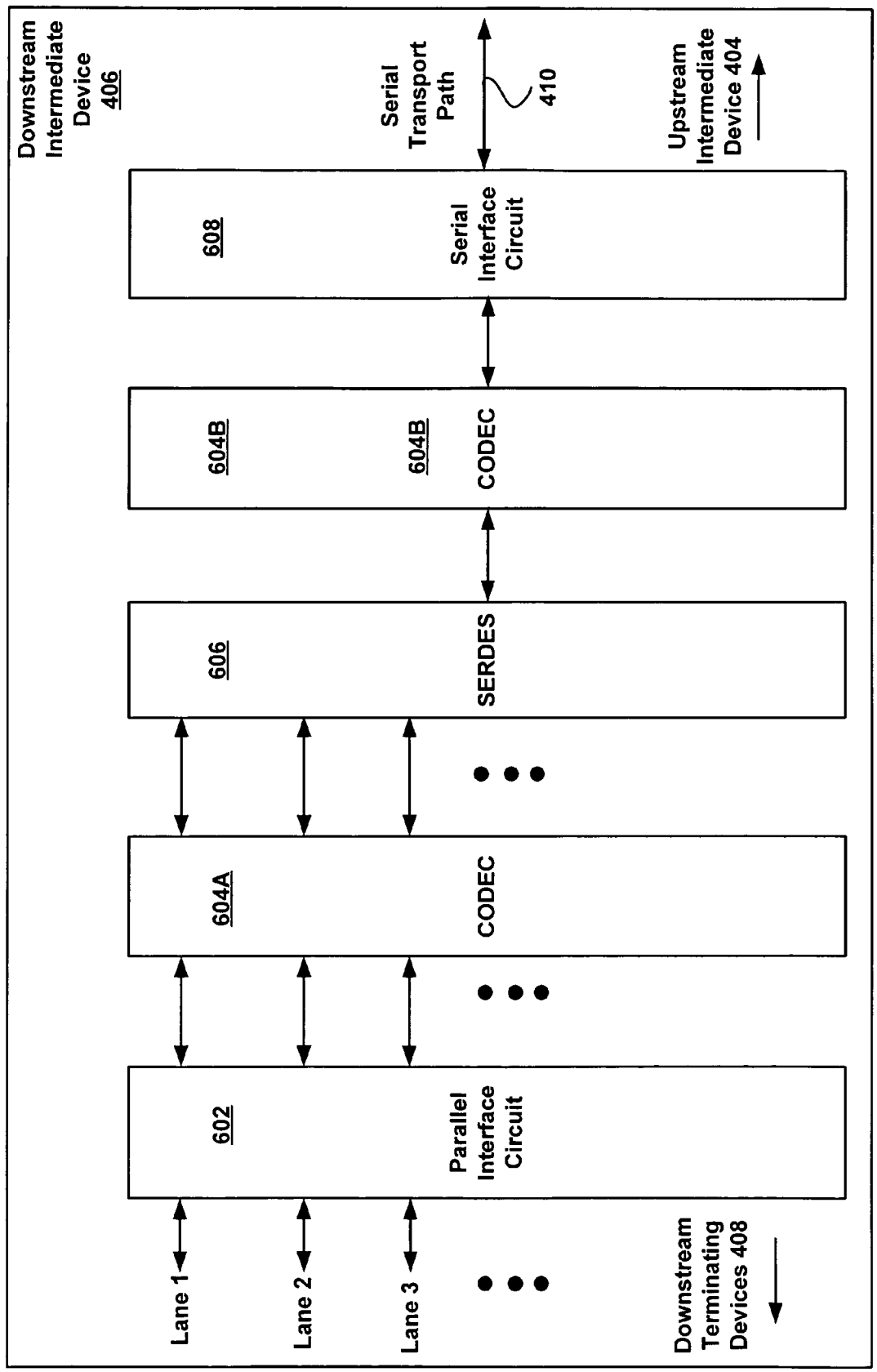
FIG. 6 is a block diagram of an embodiment of the downstream intermediate device shown in FIG. 4.

FIG. 6 is a block diagram of an embodiment of the downstream intermediate device 406 shown in FIG. 4. It may be noted that the upstream intermediate device 404 may have the same or similar structure as the downstream intermediate device 406. Therefore the following description of an embodiment of the downstream intermediate device 404 is also a description of an embodiment of the upstream intermediate device 404. The intermediate device 406 includes a parallel interface circuit 602, a first encoder/decoder ("codec") 604A, a serializer/deserializer (SERDES) 606, a second codec 604B and a serial interface circuit 608. For a differential signaling system, the parallel interface circuit 602 is configured to receive differential signals from multiple lanes. In some embodiments, the differential signals include a stream of in-band data signals and embedded clock data signals, which is extracted by a clock data recovery (CDR) circuit in the parallel interface circuit 602 (not shown). The CDR is coupled to a receiver (not shown), which samples the symbols using a sample clock derived by the CDR from the embedded clock data signal using, for example, a phase compensation circuit (e.g., delay-locked loop). In some embodiments, differential signals from the multiple lanes contain symbols corresponding to encoded data signals. In these embodiments, data signals are encoded at one or more of the terminating devices 408. The parallel interface circuit 602 provides the sampled symbols to codec 604A, which decodes the data signals using an decoding scheme, such as an 8B/10B decoding scheme. An 8B/10B decoding scheme is used in several known communication protocols, including, for example, PCI EXPRESS, SATA, INFINIBAND, and XAUI. An 8B/10B decoding scheme exhibits many desirable behaviors including a guaranteed maximum run length (e.g., a maximum run of 5 consecutive bits of identical value), a known transition density that can be indefinitely maintained and the ability to detect many types of errors (e.g., single-bit errors). Additionally, the decoding scheme guarantees a bit stream with a balanced number of '1' and '0' bits (also known as dc-free). The decoded data signals from the codec 604A is coupled to the SERDES 606, which serializes the data signals into a serial bit stream. The serialized bit stream is provided to the second codec 604B, which encodes the serialized bit stream (e.g., using an 8B/10B encoding scheme) and then forwards the symbols corresponding to the encoded bit stream to the serial interface circuit 608. The serial interface circuit 608 includes drivers (not shown) and other signal conditioning devices (not shown) for driving the bit stream onto the serial transport path 410 at voltage levels and at a frequency appropriate for the selected communication protocol.

In embodiments in which the parallel data streams received via the parallel interface circuit 602 are not encoded, the first codec 604A may be eliminated. However, in some embodiments, the data arriving at parallel interface circuit 602 is already 8B/10B encoded. In such embodiments, codec 604A decodes each of the incoming 10B data streams so as to produce corresponding 8B data streams. These data streams are then combined into a single stream by SERDES 606, and the resulting combined data steam is encoded (e.g., using 8B/10B encoding) by codec 604B.

Figure 7:
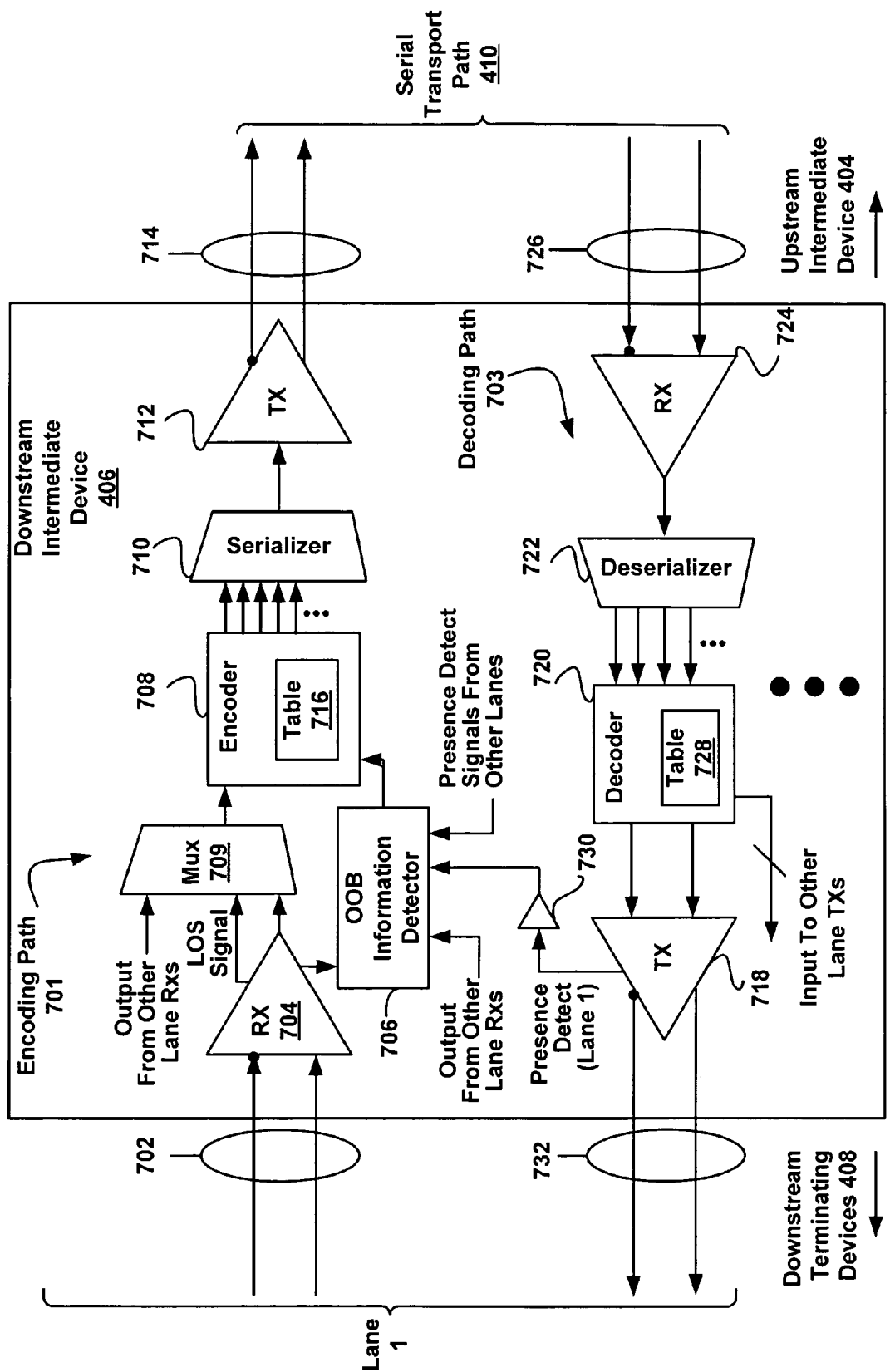
FIG. 7 is a block diagram of an embodiment of the downstream intermediate device shown in FIG. 6.

FIG. 7 is a block diagram of an embodiment of the downstream intermediate device 406 shown in FIG. 6. The downstream intermediate device 406 includes an encoding path 701 and a decoding path 703. The encoding path 701 generally includes a downstream receiver 704, an OOB information detector 706, an encoder 708 including an encoding table 716, a serializer 710 and a upstream transmitter 712. The decoding path generally includes an upstream receiver 724, a deserializer 722, a decoder 720 including a decoding table 728 and an downstream transmitter 718. While the embodiment illustrated in FIG. 7 uses differential signals, other embodiments may use single-ended signals. The intermediate device 406 may also typically include additional circuitry that has been omitted from FIG. 7 to facilitate a simplified description of certain aspects of the intermediate device 406.

Note that FIG. 7 shows only a single differential signal "Lane" (e.g., "Lane 1" in FIGS. 4 and 6) on the downstream side. It should be apparent, however, that there could be multiple differential signal lanes on the downstream side that provide both in-band data and OOB information to be multiplexed into a single serial bit stream for transmission to the upstream intermediate device 404 via the serial transport path 410. The additional lanes would operate in a similar manner to the operation of Lane 1 described below.

During operation, incoming in-band data is received by the downstream receiver 704 from the downstream receive link 702 and encoded by the encoder 708. In embodiments in which the intermediate device 406 receives two or more streams of symbols corresponding to in-band data signals (e.g., using two or more receivers 704), the plurality of the symbol steams may be routed to the encoder 708 via a multiplexer 709. In some embodiments, the encoder 708 implements an 8B/10B encoding scheme. The encoded data is serialized by the serializer 710 and transmitted to a terminating device by the upstream transmitter 712 via the upstream transmit link 714. The OOB information detector 706 monitors the differential input of the downstream receiver 704 to determine if an originating device coupled to the downstream receive link 702 is transmitting OOB information (e.g., Electrical Idle, Beacon, etc.) or actual data. The OOB information detector 706 may also monitor the downstream transmitter 718 to determine if the presence detect circuitry 730 of the transmitter 718 has detected the lack of a downstream device. In response to a detection of OOB information, the OOB information detector 706 sends a signal to the encoder 708 identifying the detected OOB information. In response to the signal, the encoder 708 selects a predefined symbol from the encoding table 716 to be transmitted in place of the identified OOB information. In some embodiments using an 8B/10B encoding scheme, the encoding table 708 includes a set of predefined control characters ("K" characters") as shown in Table I below.

TABLE I

Predefined Control Characters For 8B/10B Encoding Scheme

| Name | ABCDEFGH | Abcdeifghj | OOB Information |
|---|---|---|---|
| K28.0 | 00111000 | 0011110100 | SKP |
| K28.1 | 00111100 | 0011111001 | FTS |
| K28.2 | 00111010 | 0011110101 | SDP |
| K28.3 | 00111110 | 0011110011 | IDL |
| K28.4 | 00111001 | 0011110010 | Electric Idle |
| K28.5 | 00111101 | 0011111010 | COM |
| K28.6 | 00111011 | 0011110110 | Receiver Detect |
| K28.7 | 00111111 | 0011111000 | Beacon |
| K23.7 | 11101111 | 1110101000 | PAD |
| K27.7 | 11011111 | 1101101000 | STP |
| K29.7 | 10111111 | 1011101000 | END |
| K30.7 | 01111111 | 0111101000 | EDB |

In some embodiments, the K characters K.28.7 and K.28.4 can be used to transmit OOB information. For example, in a system employing PCI EXPRESS, the OOB information detector 706 would detect a zero common mode voltage ($V_{cm} \sim 0$) at the inputs of the receiver 704 as an Electrical Idle signal. The OOB information detector 706 would then send a signal to the encoder 708 indicating the type of OOB information that was detected (i.e., Electrical Idle, Beacon, etc.). The encoder 708 would then look-up a predefined symbol (e.g., "K28.4") in the encoding table 716 that had been previously assigned to the Electrical Idle OOB information. The encoder 708 would provide the predefined symbol to the serializer 710 for transmission on the upstream transmit link 714 via the upstream transmitter 712. If the OOB information detector 706 no longer detects an Electric Idle signal, a second signal is sent to the encoder 708 indicating that the incoming data signal is actual an in-band data signal. The encoder 708 would then cease sending the predefined symbol and start or restart its standard encoding process for the actual in-band data signal (e.g., 8B/10B encoding).

It should be apparent that any suitable K characters in Table I can be used to transmit OOB information. Suitable K characters include bit patterns that do not appear in any sequence of valid data bits, including overlapped data characters, and occur with a uniform alignment relative to byte boundaries to facilitate decoding. Note that if the OOB information include time multiplexed tri-state data (e.g., SATA COMReset/COMInit and COMWake), then the OOB information detector 706 would include suitable circuitry for processing time multiplexed data (e.g., counters, timers, etc.).

One type of OOB information of particular note is the Receiver Detect signal shown in Table I. The Receiver Detect signal is equivalent to the presence detection signal and/or LOS signals described with respect to FIG. 3. In some embodiments, each downstream transmitter 718 for each lane on the downstream side of the intermediate device 406 is coupled to a presence detect circuit 730 (sometimes called a receiver detect circuit) for detecting the presence of a downstream receiver (e.g., a receiver in a terminating device 408). In some embodiments, an LOS signal is also provided to the encoder 708 by the downstream receiver 704. In some embodiments, the Receiver Detect signal is conveyed only between intermediate devices, such as 404 and 406, and is not conveyed to or by either the terminating device(s) 408 or the originating device(s) 402.

The Receiver Detect signals can be encoded by the encoder 708 using the encoding table 716 and transmitted on the upstream link 714 via the upstream transmitter 712. The encoded Receiver Detect signals can be decoded by the upstream intermediate device (e.g., intermediate device 404) and used to change the line characteristics of the upstream differential signal lanes coupled to originating devices (e.g., originating devices 402), as previously described with respect to FIG. 3. In some embodiments, the Receiver Detect signals are bi-directional and both the upstream and downstream intermediate devices can detect the presence of originating and terminating devices, respectively, and encode such signals for transmission to the other intermediate device, so that the appropriate remedial action can be taken. In some embodiments, remedial action includes, but is not limited to, disconnecting the appropriate termination networks to make the intermediate device transparent or "invisible" to the originating or terminating devices, as previously described with respect to FIG. 3.

Figure 8:
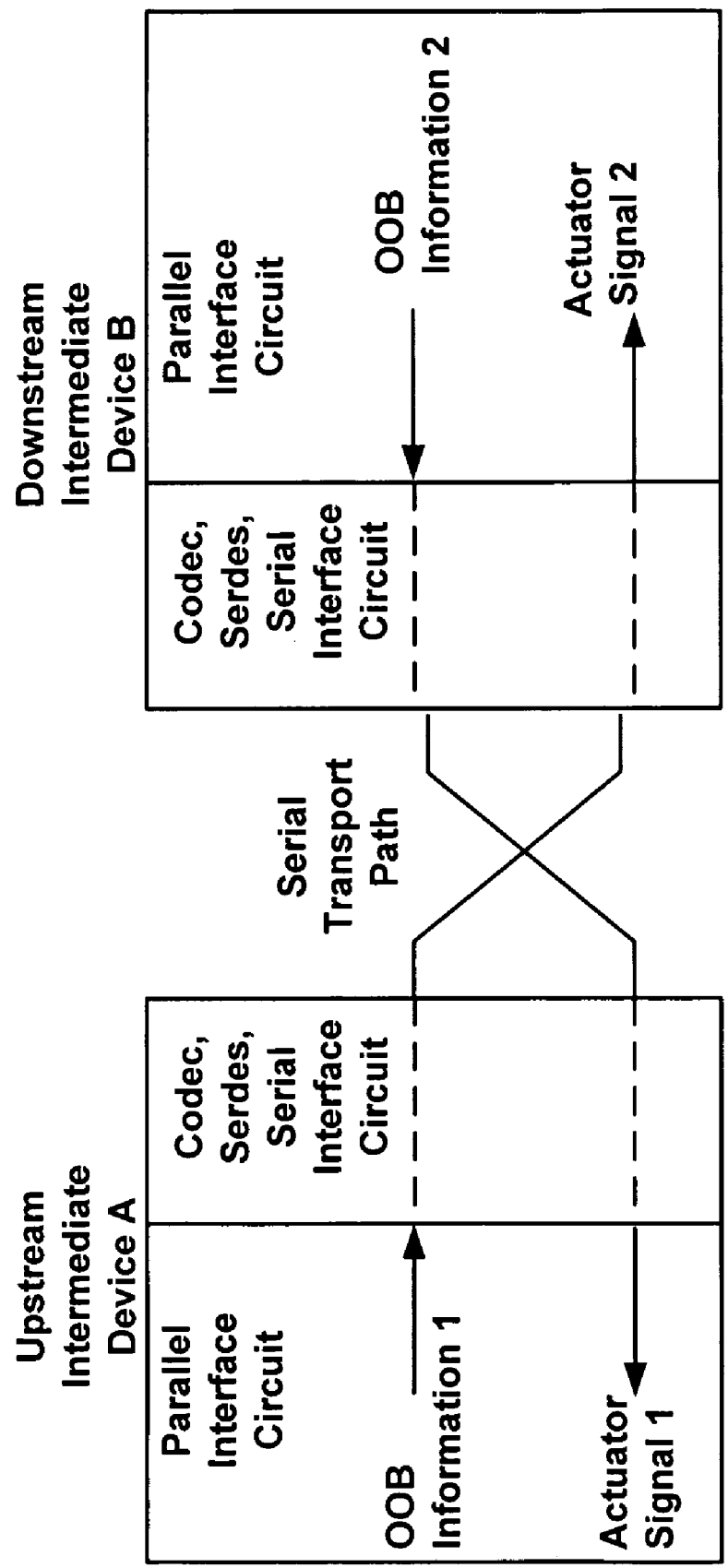
FIG. 8 is a diagram illustrating bi-directional signal flow between the upstream and downstream intermediate devices shown in FIG. 4.

FIG. 8 is a diagram illustrating bi-directional signal flow between the upstream and downstream intermediate devices 404 and 406 shown in FIG. 4. Note that the OOB information (e.g., Receiver Detect signals) can be used as actuator signals (see, e.g., signals 318, 320 in FIG. 3) to disconnect or connect termination networks to make the intermediate device transparent to originating or terminating devices.

In systems having multiple terminating devices, as shown in FIG. 4, OOB information must convey Lane status or state for each of the terminating devices. In one embodiment, this is accomplished using a control K character to identify the type of OOB information, and using time division multiplexing to transmit the information for each Lane in a separate time slice. In another embodiment, this accomplished by using a two character protocol comprising a control K character to identify the type of OOB information followed immediately by a Lane or terminating device identifier character that identifies the Lane or terminating device to which the OOB information applies. The intermediate device(s) convert the two character OOB information sequences into corresponding control signals or physical layer signals, which are then conveyed to the appropriate originating devices, as identified by the lane or terminating device identifier in the OOB information sequence.

Referring again to FIG. 7, incoming symbols corresponding to data signals and/or OOB information from the upstream intermediate device (e.g., intermediate device 404) is received by the upstream receiver 724 via the upstream receive link 726, deserialized by the deserializer 722 and decoded by the decoder 720 using the decoding table 728, which can be the same as encoding table 716 in the encoder 708. If a predefined symbol is detected, then the decoder 720 identifies the type of predefined symbol detected, maps the identified predefined symbol to an OOB information type using the corresponding entry of the decoding table 728, and transmits the OOB information to one or more downstream devices 408 in place of the predefined symbol. In some instances, the OOB information is transmitted by instantiating a signal condition on the transport path so as replicate the transport path state or signal condition on an upstream transport path. In some embodiments, the decoder 720 implements an 8B/10B decoding scheme. The decoded data is transmitted to the appropriate terminating device (e.g., terminating device 408a) by the downstream transmitter 718 via the downstream transmit link 732.

Figure 9:
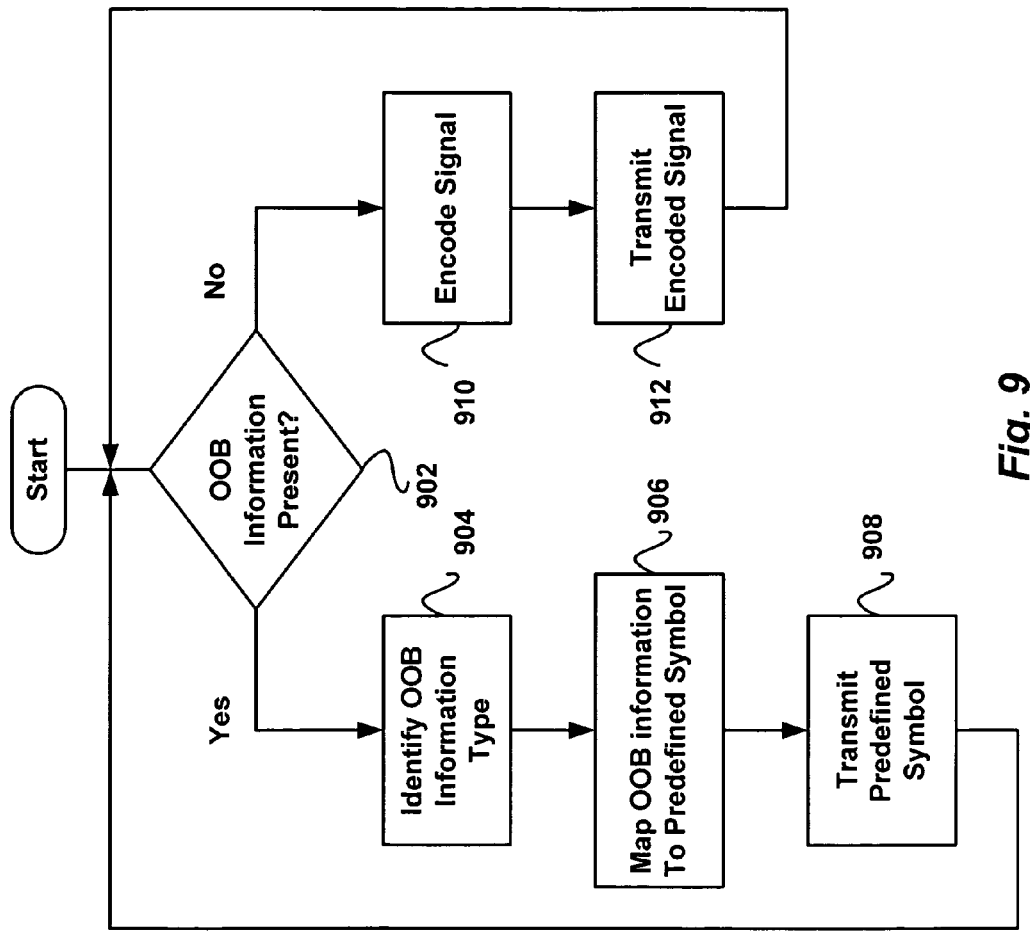
FIG. 9 is a flow diagram of an embodiment of a process for encoding OOB information.

FIG. 9 is a flow diagram of an embodiment of a process 900 for encoding OOB information. While the process 900 described below includes a number of operations that appear to occur in a specific order, it should be apparent that the process 900 operations are not limited to any particular order, and, moreover, the process 900 can include more or fewer operations, which can be executed serially or in parallel (e.g., using parallel processors or a multi-threading environment).

The process 900 begins with the OOB information detector examining the incoming signal to determine whether an OOB information is present 902. If OOB information is not present, then the incoming data signal is encoded 910 and transmitted to an upstream intermediate device or originating device 912. In some embodiments, an 8B/10B encoding scheme is used. If OOB information is detected 902, then the OOB information detector identifies the type of OOB information 904, maps the identified OOB information to a predefined symbol (e.g., an unused "K" character) selected from, for example, an encoding table 906, and transmits the predefined symbol to one or more upstream intermediate devices or originating devices in place of the OOB information 908, as previously described with respect to FIG. 7 (encode path). A similar method may be used for encoding and transmitting data signals and OOB information to a downstream intermediate device or terminating device.

Figure 10:
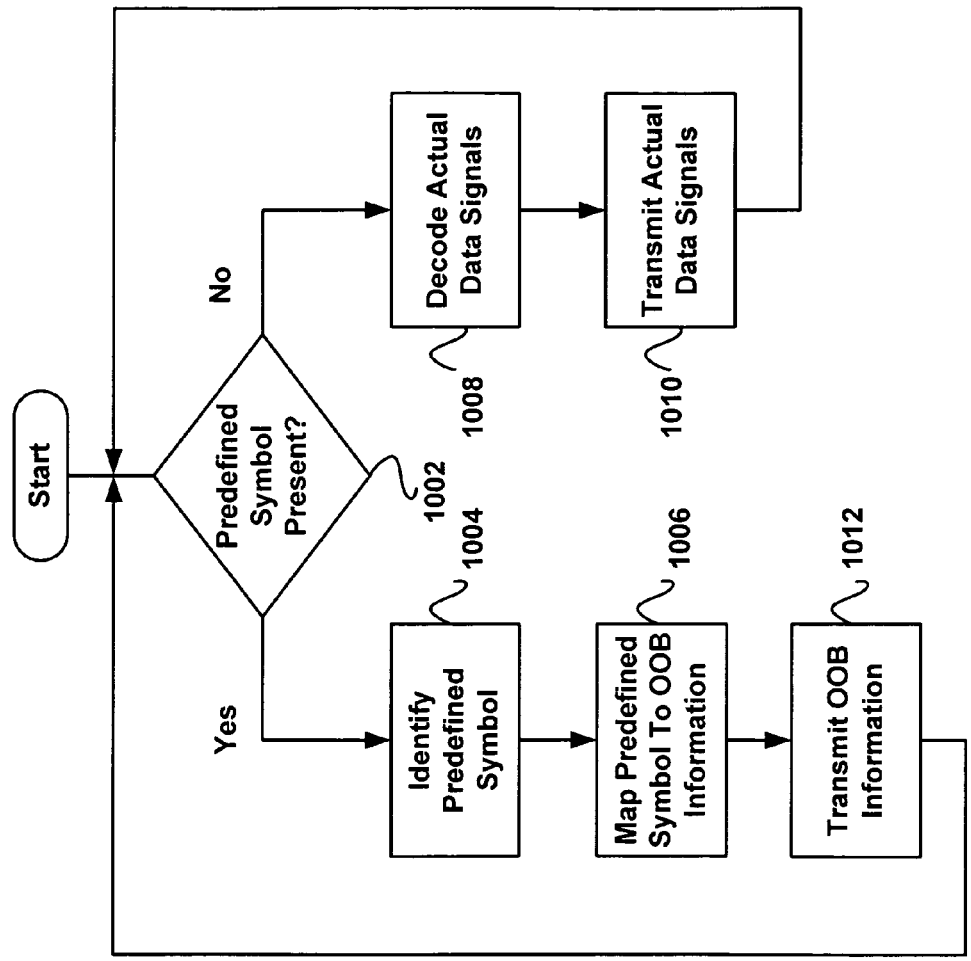
FIG. 10 is a flow diagram of an embodiment of a process for decoding OOB information.

FIG. 10 is a flow diagram of an embodiment of a process 1000 for decoding OOB information. While the process 1000 described below includes a number of operations that appear to occur in a specific order, it should be apparent that the process 1000 operations are not limited to any particular order, and, moreover, the process 1000 can include more or fewer operations, which can be executed serially or in parallel (e.g., using parallel processors or a multi-threading environment).

The process 1000 begins with the decoder examining the incoming signal to determine whether a predefined symbol is present 1002. If a predefined symbol is not present then the incoming actual data signal is decoded 1008 and transmitted to an downstream intermediate or terminating device 1010. In some embodiments, an 8B/10B decoding scheme is used. If a predefined symbol is detected 1002 then the decoder identifies the type of predefined symbol detected 1004, maps the identified predefined symbol to an OOB information type selected from, for example, a decoding table 1006, and transmits the OOB information to one or more downstream devices in place of the predefined symbol 1012, as previously described with respect to FIG. 7 (decode path). A similar process may be used for decoding and transmitting data signals and OOB information to upstream intermediate devices and originating devices.

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A circuit, comprising:
    a first interface having an input that receives a signal including one or more multiple-bit symbols representing encoded out-of-band (OOB) information from a first communication link;
    a decoder coupled to the first interface that decodes the one or more multiple-bit symbols into reconstructed OOB information; and
    a second interface coupled to the decoder and having an output for transmitting the reconstructed OOB information to a second communication link.

2. The circuit of claim 1, wherein the first interface is coupled to a serial data link.

3. The circuit of claim 1, wherein the decoder is an 8B/10B decoder and the one or more multiple-bit symbols are 10-bit control characters.

4. The circuit of claim 1, wherein the encoded OOB information represents a "Loss of Signal" status on the first communication link.

5. The circuit of claim 1, wherein the encoded OOB information includes signal state information selected from the set comprising Electrical Idle, Receiver Detect, Beacon, COMReset/COMInit and COMWake.

6. The circuit of claim 1, wherein the received signal includes one or more data symbols corresponding to an in-band data signal, and the decoder decodes the data symbols to generate a data signal.

7. The circuit of claim 6, including a deserializer coupled to the decoder for deserializing the data symbols prior to decoding;
   wherein the second interface includes a transmitter coupled to the decoder for transmitting the data signal on the second communication link.

8. A method of bridging out-of-band (OOB) information across a device, comprising:
   encoding OOB information, including:
     receiving a first signal from a first communication link, and
     if the first signal includes OOB information:
       identifying the OOB information,
       selecting a symbol representing the OOB information, and
       transmitting the symbol on a serial data communication link; and
   decoding OOB information, including:
     receiving a second signal comprising a plurality of multiple-bit symbols from the serial data communication link,
     evaluating at least some of the symbols in the plurality of multiple-bit symbols to determine if any of the evaluated symbols is associated with OOB information, and
     for any evaluated symbols that are associated with OOB information, and
       decoding the evaluated symbol associated with OOB information to produce reconstructed OOB information.

9. The method of claim 8, wherein the OOB information comprises "Loss of Signal".

10. The method of claim 8, wherein the OOB information includes signal state information selected from the set comprising Electrical Idle, Receiver Detect, Beacon, COMReset/COMInit and COMWake.

11. The method of claim 8, further comprising:
    serializing the symbol prior to transmitting the symbol on the serial data communication link; and
    transmitting the reconstructed OOB information on a second communication link.

12. A method of bridging out-of-band (OOB) information across a device, comprising:
    receiving a signal comprising a plurality of multiple-bit symbols from a first communication link;
    evaluating at least some of the symbols in the plurality of multiple-bit symbols to determine if any of the evaluated symbols is associated with OOB information; and
    for any evaluated symbols that are associated with OOB information,
      decoding the evaluated symbol associated with OOB information to produce reconstructed OOB information; and
      transmitting the reconstructed OOB information on a second communication link.

13. The method of claim 12, wherein the OOB information comprises "Loss of Signal".

14. The method of claim 12, wherein the OOB information includes signal state information selected from the set including Electrical Idle, Receiver Detect, Beacon, COMReset/COMInit and COMWake.

15. The method of claim 12, wherein the signal includes data symbols corresponding to an in-band data signal, the method further comprising:
    deserializing the data symbols;
    decoding the data symbols; and
    transmitting a decoded data signal on the second communication link.

16. A system for bridging out-of-band (OOB) information across an interface, comprising:
    means for receiving a first signal from a first communication link;
    if the first signal comprises OOB information:
      means for identifying the OOB information;
      means for selecting a symbol representing the OOB information;
      means for transmitting the symbol on a serial data communication link;
    means for receiving a second signal including one or more multiple-bit symbols representing encoded out-of-band (OOB) information from the serial data communication link; and
    means for decoding the one or more multiple-bit symbols into reconstructed OOB information.

17. The system of claim 16, further comprising means for transmitting the reconstructed OOB information on a second communication link.

18. A computer readable storage medium containing data representing a circuit that includes:
    a first circuit, including:
      a first input interface to receive a signal from a first communication link, wherein the signal includes out-of band (OOB) information;
      an encoder to encode the OOB information into corresponding symbols; and
      a first output interface to transmit the symbols to a serial data communication link; and
    a second circuit, including:
      a second input interface to receive a signal including one or more multiple-bit symbols representing encoded out-of band (OOB) information from the serial data communication link; and
      a decoder to decode the one or more multiple-bit symbols into reconstructed OOB information.

19. The storage medium of claim 18, further comprising a transmitter for transmitting the reconstructed OOB information on a second communication link.

20. A computer readable storage medium containing data representing a circuit that includes:
    a first interface having an input that receives a signal including one or more multiple-bit symbols representing encoded out-of band (OOB) information from a first communication link;
    a decoder coupled to the first interface that decodes the one or more multiple-bit symbols into reconstructed OOB information; and
    a second interface coupled to the decoder and having an output for transmitting the reconstructed OOB information to a second communication link.

21. A circuit, comprising:
    an encoding path, including:
      a first input interface to receive a first signal from a first communication link, wherein the first signal includes out-of-band (OOB) information,
      an encoder to encode the OOB information into corresponding symbols, and
      a first output interface to transmit the symbols to a serial data communication link; and
    a decoding path, including:
      a second input interface to receive a second signal from the serial data communication link, the second signal including one or more multiple-bit symbols representing encoded out-of-band (OOB) information, and a decoder to decode the one or more multiple-bit symbols into reconstructed OOB information.

22. The circuit of claim 21, wherein:
the encoding path further including a detector coupled to the first input interface to detect the OOB information, the encoder coupled to the detector,
the decoding path further including a second output interface for transmitting the reconstructed OOB information to a second communication link.

23. The circuit of claim 21, wherein the decoder is an 8B/10B decoder and the one or more multiple-bit symbols are 10-bit control characters.

24. The circuit of claim 21, wherein the second signal includes one or more data symbols corresponding to an in-band data signal, and the decoder decodes the data symbols to generate a data signal.

25. The circuit of claim 24, the decoding path including a deserializer coupled to the decoder for deserializing the data symbols prior to decoding.

26. The circuit of claim 21, wherein the encoder encodes at least a portion of the first signal received by the first input interface into a stream of data symbols corresponding to an in-band data signal.

27. The circuit of claim 26, wherein the encoder is an 8B/10B encoder and the symbols are control characters.

28. The circuit of claim 21, wherein the OOB information represents a "Loss of Signal" status on the first communication link.

29. The circuit of claim 21, wherein the OOB information includes signal state information selected from the set comprising Electrical Idle, Receiver Detect, Beacon, COMReset/COMInit and COMWake.

30. The circuit of claim 21, the encoding path further comprising:
a serializer coupled to the encoder to serialize the symbols prior to transmission by the first output interface.

* * * * *